United States Patent
Han

(10) Patent No.: US 12,308,081 B2
(45) Date of Patent: May 20, 2025

(54) CONFIGURABLE TESTING AND REPAIR SYSTEM FOR NON-VOLATILE MEMORY

(71) Applicant: iSTART-TEK Inc., Zhubei (TW)

(72) Inventor: Cheng-Yen Han, Zhubei (TW)

(73) Assignee: iSTART-TEK INC., Zhubei (TW)

( * ) Notice: Subject to any disclaimer, the term of this patent is extended or adjusted under 35 U.S.C. 154(b) by 0 days.

(21) Appl. No.: 18/428,471

(22) Filed: Jan. 31, 2024

(65) Prior Publication Data

US 2024/0321375 A1 Sep. 26, 2024

(30) Foreign Application Priority Data

Mar. 25, 2023 (TW) ................. 112202751

(51) Int. Cl.
*G11C 29/12* (2006.01)

(52) U.S. Cl.
CPC .................. *G11C 29/12* (2013.01)

(58) Field of Classification Search
None
See application file for complete search history.

(56) References Cited

U.S. PATENT DOCUMENTS

| | | | | |
|---|---|---|---|---|
| 7,295,480 B2 * | 11/2007 | McPartland | ....... | G11C 29/4401 365/201 |
| 8,677,306 B1 * | 3/2014 | Andreev | ........... | G06F 11/267 714/39 |
| 9,640,279 B1 * | 5/2017 | Popps | ............. | G11C 29/4401 |
| 2006/0031726 A1 * | 2/2006 | Zappa | ........... | G11C 29/4401 714/718 |
| 2011/0113280 A1 * | 5/2011 | Chickanosky | ........ | G11C 29/76 714/E11.169 |
| 2018/0174665 A1 * | 6/2018 | Kraipak | ........... | G11C 29/36 |
| 2022/0082620 A1 * | 3/2022 | Ravinarayanan | | G01R 31/318555 |
| 2023/0135977 A1 * | 5/2023 | Kan | ........ | G11C 29/16 716/136 |

(Continued)

OTHER PUBLICATIONS

R. K. Sharma and A. Sood, "Modeling and Simulation of Multi-operation Microcode-Based Built-In Self Test for Memory Fault Detection and Repair," 2010 IEEE Computer Society Annual Symposium on VLSI, Lixouri, Greece, 2010, pp. 381-386, (Year: 2010).*

(Continued)

*Primary Examiner* — Daniel F. McMahon
(74) *Attorney, Agent, or Firm* — Wang Law Firm, Inc.

(57) ABSTRACT

A configurable testing and repair system for a non-volatile memory includes: a memory testing device capable of carrying a to-be-tested memory performs a test operation on the to-be-tested memory to determine whether or not the to-be-tested memory is a to-be-repaired memory that needs to be repaired, and performs a diagnostic operation on the to-be-repaired memory, so as to generate defect data including a fault address and a fault data value; a memory repair device capable of carrying the to-be-repaired memory performs a repair operation on the to-be-tested memory according to the defect data; and a control device connected to the memory testing device and the memory repair device controls the memory testing device to perform the test operation and the diagnostic operation, and to control the memory repair device to perform the repair operation.

10 Claims, 3 Drawing Sheets

(56) References Cited

U.S. PATENT DOCUMENTS

2023/0185633 A1* 6/2023 Varadarajan ..... G11C 29/56008
718/104

OTHER PUBLICATIONS

Alnatheer S, Ahmed MA. Optimal Method for Test and Repair Memories Using Redundancy Mechanism for SoC. Micromachines (Basel). Jul. 10, 2021;12(7): (Year: 2021).*

* cited by examiner

CONFIGURABLE TESTING AND REPAIR SYSTEM FOR NON-VOLATILE MEMORY

CROSS-REFERENCE TO RELATED APPLICATION

This application claims priority from Taiwan Patent Application No. 112202751, filed on Mar. 25, 2023, in the Taiwan Intellectual Property Office, the content of which is hereby incorporated by reference in its entirety for all purposes.

BACKGROUND OF THE INVENTION

1. Field of the Invention

The present disclosure relates to a memory testing and repair system, and more particularly to a configurable memory testing and repair system for a non-volatile memory capable of saving manual coding time for testing and repairing the non-volatile memory, and increasing yield for repairing non-volatile memory failures.

2. Description of the Related Art

In general, it is imperative to conduct tests on memory components upon completion of their production. This process ensures that the functionality of these components is intact. The results derived from these tests are then utilized to ascertain the qualification status of each memory component. Through testing, defective parts within memory components can be identified. Further, these defective parts can be repaired, enabling the repaired memory components to pass the tests and be deemed as qualified.

Typically, the non-volatile memory (NVM) testing and repair tools that are readily available in the market are limited in their functionality. They are designed to manually write test and repair codes for a single instance of the non-volatile memory. This presents a challenge when there is a need to immediately conduct tests and repairs on non-volatile memories from a variety of manufacturers and of diverse memory spaces. Consequently, the utilization of the existing non-volatile memory testing and repair tools necessitates the manual coding for distinct memories. However, this process is quite time-consuming.

Hence, the challenge lies in designing a configurable system for testing and repair a non-volatile memory capable of enhancing a success rate of rectifying faults in non-volatile memory, thereby addressing the technical issues inherent in the art.

SUMMARY OF THE INVENTION

In view of the above problems, the objective of the present disclosure is to provide a configurable testing and repair system for a non-volatile memory.

To achieve the foregoing objective, the present disclosure provides a configurable testing and repair system for a non-volatile memory, and the configurable testing and repair system includes: a memory testing device capable of carrying a to-be-tested memory, in which the memory testing device is configured to perform a test operation on the to-be-tested memory to determine whether or not the to-be-tested memory is a to-be-repaired memory that needs to be repaired, and the memory testing device is configured to perform a diagnostic operation on the to-be-repaired memory, so as to generate defect data including a fault address and a fault data value; a memory repair device capable of carrying the to-be-repaired memory, in which the memory repair device is configured to perform a repair operation on the to-be-tested memory according to the defect data; and a control device connected to the memory testing device and the memory repair device, in which the control device is configured to control the memory testing device to perform the test operation and the diagnostic operation, and to control the memory repair device to perform the repair operation.

In a preferred embodiment of the present disclosure, the to-be-tested memory is a non-volatile memory (NVM).

In a preferred embodiment of the present disclosure, the control device further includes a test pattern unit that is configured to generate a test pattern corresponding to the to-be-repaired memory according to the defect data, and the test pattern is provided to an automatic test equipment (ATE).

In a preferred embodiment of the present disclosure, the test pattern is defined and expressed by a standard test interface language (STIL) format.

In a preferred embodiment of the present disclosure, the control device further includes a built-in self-test (BIST)/built-in self-repair (BISR) unit configured to generate a built-in self-test/built-in self-repair code according to the defect data.

In a preferred embodiment of the present disclosure, the built-in self-test/built-in self-repair code is defined and expressed in a register-transfer level (RTL) format or a gate-level netlist format.

In a preferred embodiment of the present disclosure, the control device further includes a simulation unit, which is configured to create a built-in self-test/built-in self-repair semiconductor intellectual property (IP) circuit environment after the to-be-repaired memory is repaired.

In a preferred embodiment of the present disclosure, the simulation unit is configured to execute the test pattern under the built-in self-test/built-in self-repair semiconductor intellectual property circuit environment according to the test pattern, so as to perform another test on the to-be-repaired memory.

In a preferred embodiment of the present disclosure, the control device includes a graphical user interface for a user to select a type, test items, a supplier, a memory space, an output interface, and a semiconductor intellectual property model of the to-be-tested memory.

In a preferred embodiment of the present disclosure, the graphical user interface further includes a display and a plurality of operating elements for the user to operate.

In summary, in the configurable testing and repair device for the non-volatile memory provided by the present disclosure, a graphical user interface can be provided for users to operate and set different parameters according to different to-be-tested memories. Moreover, corresponding test patterns and built-in self-test/built-in self-repair code can be generated after the test is completed, and a built-in self-test/built-in self-repair semiconductor intellectual property circuit environment can be established based on the built-in self-test/built-in self-repair code to simulate the test patterns, or to simulate the test patterns on an automatic testing machine, thereby facilitating comprehensive post-testing procedures for the memories. By leveraging the aforementioned configuration, the coding time required for users to execute memory testing and repair can be significantly reduced, which in turn enhances the efficiency of testing and repairing the non-volatile memories.

BRIEF DESCRIPTION OF THE DRAWINGS

The features and technical contents of the present disclosure will be further appreciated and understood with reference to the detailed description of preferred embodiments and accompanying drawings.

DETAILED DESCRIPTION OF THE PREFERRED EMBODIMENTS

The present disclosure will be illustrated in detail below with preferred embodiments and accompanying drawings. It should be noted that, the shape and scale of the diagrams disclosed in each embodiment below are intended to account for the technical features of the present disclosure, and are not intended to limit the aspects of the present disclosure on the practical implementation.

It is to be acknowledged that, although the terms "first", "second", and so on, may be used herein to describe various elements, components, areas, sections, layers and/or parts, these elements, components, areas, sections, layers and/or parts should not be limited by these terms. These terms are used only for the purpose of distinguishing one element, component, area, section, layer and/or part from another element, component, area, section, layer and/or part. Therefore, in the following discussion, the terms "first element", "first component", "first region", "first layer" and/or "first part" may be referred to as "second element", "second component", "second region", "second layer" and/or "second part".

The meaning of "comprise" and/or "include" specifies a feature, a region, a whole body, a step, a process, an element and/or a component but does not exclude one or more other features, regions, whole bodies, steps, processes, elements and/or components.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and the present specification, and should not be interpreted in an idealized or overly formal sense, unless expressly so defined herein.

Hereinafter, exemplary embodiments will be described in conjunction with the accompanying drawings. These drawings are simplified diagrams, which only illustrate the basic structure of the present disclosure in a schematic manner, and therefore are not intended to limit the present disclosure.

Figure 1:
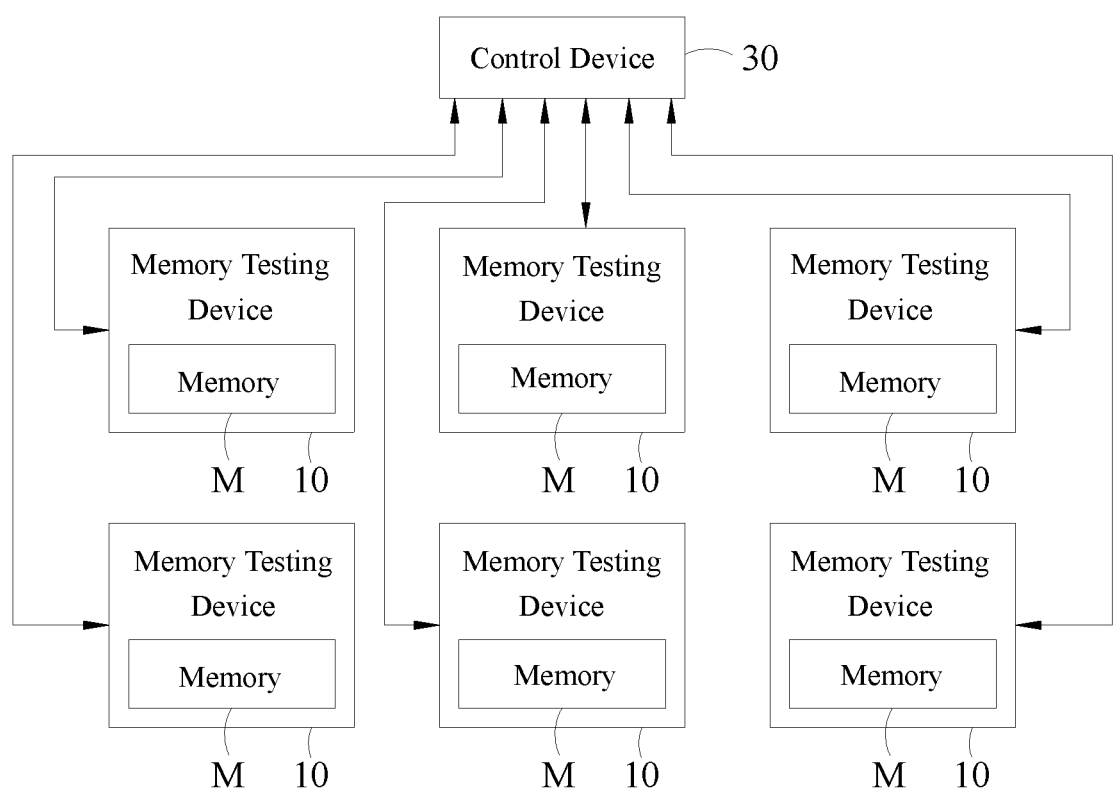
FIG. 1 is a block diagram of a control device and a memory testing device of a configurable testing and repair system for a non-volatile memory according to one embodiment of the present disclosure.
Figure 2:
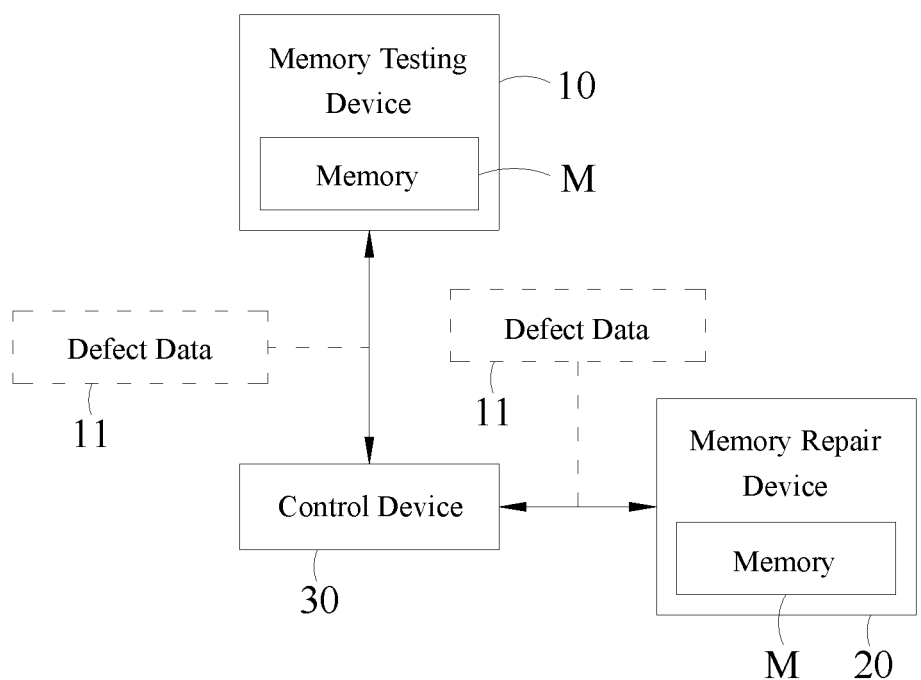
FIG. 2 is a block diagram of the configurable testing and repair system for the non-volatile memory according to one embodiment of the present disclosure.
Figure 3:
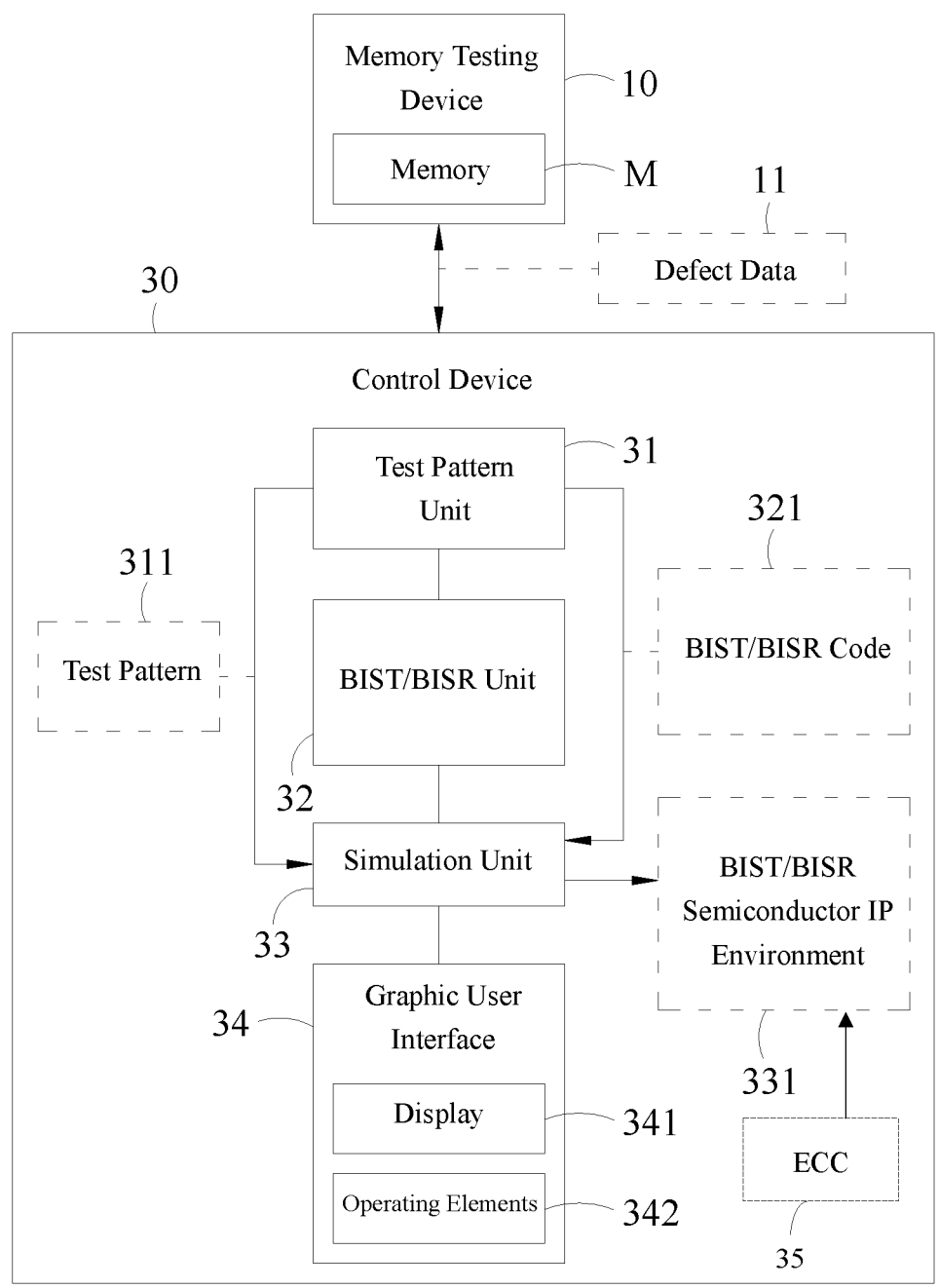
FIG. 3 is a detailed block diagram of the control device of the configurable testing and repair system for the non-volatile memory according to one embodiment of the present disclosure.

Reference is made to FIGS. 1 to 3, FIG. 1 is a block diagram of a control device and a memory testing device of a configurable testing and repair system for a non-volatile memory according to one embodiment of the present disclosure, FIG. 2 is a block diagram of the configurable testing and repair system for the non-volatile memory according to one embodiment of the present disclosure, and FIG. 3 is a detailed block diagram of the control device of the configurable testing and repair system for the non-volatile memory according to one embodiment of the present disclosure.

As shown in FIGS. 1 and 2, in order to address the above-referenced technical inadequacies, the present disclosure provides a configurable testing and repair system 1 for a non-volatile memory, and the configurable testing and repair system 1 includes a memory testing device 10, a memory repair device 20, and a control device 30. The memory testing device 10 is capable of carrying a to-be-tested memory M, the memory testing device 10 is configured to perform a test operation on the to-be-tested memory M to determine whether or not the to-be-tested memory M is a to-be-repaired memory M that needs to be repaired, and the memory testing device 10 is configured to perform a diagnostic operation on the to-be-repaired memory M, so as to generate defect data 11 including a fault address and a fault data value. The memory repair device 20 is capable of carrying the to-be-repaired memory M, and the memory repair device 20 performs a repair operation on the to-be-tested memory M according to the defect data 11. Moreover, the control device 30 is connected to the memory testing device 10 and the memory repair device 20, the control device 30 is configured to control the memory testing device 10 to perform the test operation and the diagnostic operation, and to control the memory repair device 20 to perform the repair operation. The memory M carried by the memory testing device 10 or the memory repair device 20 is a non-volatile memory (NVM).

Reference is made to FIG. 3, in this embodiment, the control device 30 includes a graphical user interface 34 for the user to select a type, test items, a supplier, a memory space, an output interface, and a semiconductor intellectual property model of the to-be-tested memory M. Moreover, the graphical user interface 34 further includes a display 341 and a plurality of operating elements 342 for the user to operate. In this embodiment, the display 341 can be a liquid crystal display, and the plurality of operating elements 342 can be a mouse and a keyboard. However, the present disclosure is not limited thereto. In other embodiments, the display can be a panel display such as an organic light emitting diode display, a light emitting diode display, a field emission display, an electroluminescent display, and the like. When the display is a display such as a touch panel, a configuration of operating components can be omitted.

Specifically, after the memory M is produced, the to-be-tested memory M needs to be tested to determine whether or not the memory M is qualified based on test results. First, the to-be-tested memory M can be carried in the memory testing device 10, in this embodiment, as shown in FIG. 1, the control device 30 is connected to six memory testing devices 10, and each memory testing device 10 is equipped with one to-be-tested memory M, so as to test multiple ones of the to-be-tested memory M at the same time, but the present disclosure is not limited thereto. In other embodiments, the user can adjust a quantity of the memory testing devices connected to the control device, and a quantity of to-be-tested memory carried by each of the memory testing devices according to actual needs. For example, in other embodiments, the control device can be connected to more memory testing devices, such as more than six, or only to one memory testing device. In addition, each memory testing device can carry more than one to-be-tested memories, so as to improve the efficiency for testing the memories.

Next, the graphical user interface 34 of the control device 30 can be used by the user to select a type, test items, a supplier, a memory space, an output interface, an user programming code security protection mechanism and a semiconductor intellectual property model of the to-be-tested memory, so as to perform the test operation on the to-be-tested memory M. Specifically, in the test parameters that can be set through the graphical user interface 34, the type of the to-be-tested memory M can include, for example: an embedded flash (eFlash) memory, a resistive random-access memory (ReRAM), a multiple-times programmable (MTP) memory, or a one-time programmable (OTP) memory. The suppliers can include, for example: Silicon Storage Technology, Inc. (SST), United Microelectronics Corporation (UMC), eMemory, Yield Microelectronics Corporation (YMC), Chengdu Analog Circuit Technology Inc. (ACTT), or Attopsemi Technology. The memory space can include, for example: 128K×32, 16K×32, 16K×128, 64K×144, 32K×72, or 512K×32. The output interfaces can include, for example: JTAG, IEEE1149.1 (JTAG) interface, IEEE1149.7 interface and Serial Peripheral Interface Bus (SPI).

Further, the memory testing device 10 can determine whether or not the to-be-tested memory M is an unqualified memory M that needs to be repaired based on the test results. In response to determining that determines that the to-be-tested memory M is unqualified, the memory testing device 10 performs a diagnostic operation on the to-be-tested memory M to generate the defect data 11 including the fault address and the fault data value. The memory testing device 10 transmits the defect data 11 to the control device 30 for repair according to a redundancy provided by the memory supplier. Specifically, the redundancy can include a redundancy sector, a bit line redundancy, and a word line redundancy. In addition, the defect data 11 can include the test items used in this test operation.

After completing the diagnosis operation of the memory M, the to-be-repaired memory M is mounted on the memory repair device 20, and the memory repair device 20 receives the defect data 11 from the control device 30 to repair the to-be-repaired memory M according to the fault address and the fault data value of the defect data 11, such that the memory M after repair has a better usage yield.

Specifically, during the repair operation of the memory M, the memory repair device 20 can store addresses of faulty memory sectors where the memory M is defective according to the defect data 11. In instances where diverse defects are present within the same memory sector, it is identified as a singular faulty memory sector. Next, the memory repair device 20 can replace the faulty memory sectors of the to-be-repaired memory M according to the plurality of redundancy sectors provided by the memory supplier. When a quantity of the faulty memory sectors is greater than a quantity of the redundancy sectors provided by the memory supplier, the memory repair device 20 is unable to perform the repair operation, and the display 341 of the graphical user interface 34 will display a message to indicate that the repair operation is failed and display a test result that indicates the memory M is a faulty memory. On the contrary, when the quantity of the faulty memory sectors is less than the quantity of the redundancy sectors provided by the memory supplier, the memory repair device 20 can use the redundancy sectors to replace the faulty memory sectors to complete the repair operation. The display 341 of the graphical user interface 34 will display a message to indicate that the repair operation is successfully performed and display a test result that indicates the memory M is a valid memory.

Alternatively, during the repair operation of the memory M, the memory repair device 20 can store addresses of faulty bit lines and faulty word lines of the memory M according to the defect data 11. Next, the memory repair device 20 can replace the faulty bit lines of the to-be-repaired memory M according to multiple ones of the bit line redundancy provided by the memory supplier. When a quantity of the faulty bit lines is greater than a quantity of multiple ones of the bit line redundancy provided by the memory supplier, the memory repair device 20 is unable to perform the repair operation, and the display 341 of the graphical user interface 34 will display a message to indicate that the repair operation is failed and display a test result that indicates the memory M is a faulty memory. On the contrary, when the quantity of the faulty bit lines is less than the quantity of multiple ones of the bit line redundancy provided by the memory supplier, the memory repair device 20 can use the multiple ones of the bit line redundancy to replace the faulty bit lines to complete the repair operation. The display 341 of the graphical user interface 34 will display a message to indicate that the repair operation is successfully performed and display a test result that indicates the memory M is a valid memory.

Similarly, the memory repair device 20 can replace the faulty word lines of the to-be-repaired memory M according to multiple ones of the word line redundancy provided by the memory supplier. When a quantity of the faulty word lines is greater than a quantity of multiple ones of the word line redundancy provided by the memory supplier, the memory repair device 20 is unable to perform the repair operation, and the display 341 of the graphical user interface 34 will display a message to indicate that the repair operation is failed and display a test result that indicates the memory M is a faulty memory. On the contrary, when the quantity of the faulty word lines is less than the quantity of multiple ones of the word line redundancy provided by the memory supplier, the memory repair device 20 can use the multiple ones of the word line redundancy to replace the faulty word lines to complete the repair operation. The display 341 of the graphical user interface 34 will display a message to indicate that the repair operation is successfully performed and display a test result that indicates the memory M is a valid memory. After completing the test and repair operation of the memory M, also support SoC users error correction code (ECC) 35 function to correct 1-bit error in function mode operation.

Reference is made to FIG. 3, the control device 30 of the configurable testing and repair system 1 for the non-volatile memory provided by the present disclosure further includes a test pattern unit 31, a built-in self-test (BIST)/built-in self-repair (BISR) unit 32 and a simulation unit 33.

Specifically, after the memory repair device 20 completes the repair operation of the memory M, the test pattern unit 31 of the control device 30 can generate a test pattern 311 corresponding to the memory M according to the defect data 11. This test pattern 311 can be provided to an automatic test equipment (ATE) to perform automatic test operations on the memory M according to the test pattern 311. Moreover, in the present embodiment, the test pattern 311 is defined and expressed by a standard test interface language (STIL) format.

In addition, after the test pattern unit 31 of the control device 30 generates the test pattern 311, the BIST/BISR unit 32 of the control device 30 can be configured to generate the built-in self-test (BIST)//built-in self-repair (BISR) code 321 according to the defect data 11. Moreover, in this embodiment, the BIST/BISR code 321 is defined and expressed by a register-transfer level (RTL) format or gate-level netlist format.

Furthermore, the simulation unit 33 of the control device 30 can receive the BIST/BISR code 321 from the BIST/BISR unit 32, so as to create a BIST/BISR semiconductor intellectual property (IP) circuit environment 331. Moreover, the simulation unit 33 can receive the test pattern 311 from the test pattern unit 31. In this way, the simulation unit 33 is configured to execute the test pattern 311 under the BIST/BISR semiconductor IP circuit environment 331 according to the test pattern, so as to perform another test on the to-be-repaired memory M, thereby effectively improving the yield of the memory M in the production process.

In summary, in the configurable testing and repair device for the non-volatile memory provided by the present disclosure, a graphical user interface can be provided for users to operate and set different parameters according to different to-be-tested memories. Moreover, corresponding test patterns and built-in self-test/built-in self-repair code can be generated after the test is completed, and a built-in self-test/built-in self-repair semiconductor intellectual property circuit environment can be established based on the built-in self-test/built-in self-repair code to simulate the test patterns, or to simulate the test patterns on an automatic testing machine, thereby facilitating comprehensive post-testing procedures for the memories. By leveraging the aforementioned configuration, the coding time required for users to execute memory testing and repair can be significantly reduced, which in turn enhances the efficiency of testing and repairing the non-volatile memories.

The present disclosure has been described above with preferred embodiments, but the description of preferred embodiments is not intended to limit the scope of the present disclosure. Many modifications and variations will be apparent to those having ordinary skill in the art without departing from the spirit and scope of the present disclosure. Therefore, the scope of the present disclosure should be defined by the appended claims.

What is claimed is:

1. A configurable testing and repair system for a non-volatile memory, comprising:
    a memory testing device capable of carrying a to-be-tested memory, the memory testing device being configured to perform a test operation on the to-be-tested memory to determine whether or not the to-be-tested memory is a to-be-repaired memory that needs to be repaired, and the memory testing device being configured to perform a diagnostic operation on the to-be-repaired memory, so as to generate defect data including a fault address and a fault data value;
    a memory repair device capable of carrying the to-be-repaired memory, the memory repair device being configured to perform a repair operation on the to-be-tested memory according to the defect data; and
    a control device connected to the memory testing device and the memory repair device, the control device being configured to control the memory testing device to perform the test operation and the diagnostic operation, and to control the memory repair device to perform the repair operation.

2. The configurable testing and repair system according to claim 1, wherein the to-be-tested memory is a non-volatile memory.

3. The configurable testing and repair system according to claim 1, wherein the control device further includes a test pattern unit that is configured to generate a test pattern corresponding to the to-be-repaired memory according to the defect data, and the test pattern is provided to an automatic test equipment.

4. The configurable testing and repair system according to claim 3, wherein the test pattern is defined and expressed by a standard test interface language format.

5. The configurable testing and repair system according to claim 3, wherein the control device further includes a built-in self-test/built-in self-repair unit configured to generate a built-in self-test/built-in self-repair code according to the defect data.

6. The configurable testing and repair system according to claim 5, wherein the BIST/BISR code is defined and expressed by a register-transfer level format or a gate-level netlist format.

7. The configurable testing and repair system according to claim 5, wherein the control device further includes a simulation unit, which is configured to create a built-in self-test/built-in self-repair semiconductor intellectual property circuit environment after the to-be-repaired memory is repaired.

8. The configurable testing and repair system according to claim 7, wherein the simulation unit is configured to execute the test pattern under the built-in self-test/built-in self-repair semiconductor intellectual property circuit environment according to the test pattern, so as to perform another test on the to-be-repaired memory.

9. The configurable testing and repair system according to claim 1, wherein the control device includes a graphical user interface for a user to select a type, test items, a supplier, a memory space, an output interface, and a semiconductor intellectual property model of the to-be-tested memory.

10. The configurable testing and repair system according to claim 9, wherein the graphical user interface further includes a display and a plurality of operating elements for the user to operate.

* * * * *